(12) United States Patent
Wang et al.

(10) Patent No.: US 11,393,887 B2
(45) Date of Patent: Jul. 19, 2022

(54) SUBSTRATE AND DISPLAY APPARATUS

(71) Applicant: BOE Technology Group Co., Ltd., Beijing (CN)

(72) Inventors: Pinfan Wang, Beijing (CN); Ming Che Hsieh, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 243 days.

(21) Appl. No.: 16/634,754

(22) PCT Filed: Jun. 20, 2019

(86) PCT No.: PCT/CN2019/092119
§ 371 (c)(1),
(2) Date: Jan. 28, 2020

(87) PCT Pub. No.: WO2020/007200
PCT Pub. Date: Jan. 9, 2020

(65) Prior Publication Data
US 2020/0161384 A1 May 21, 2020

(30) Foreign Application Priority Data

Jul. 4, 2018 (CN) .......................... 201821056640.4

(51) Int. Cl.
*H01L 27/32* (2006.01)
*G06F 1/16* (2006.01)
*H01L 51/00* (2006.01)

(52) U.S. Cl.
CPC .......... *H01L 27/326* (2013.01); *G06F 1/1652* (2013.01); *H01L 51/0097* (2013.01)

(58) Field of Classification Search
None
See application file for complete search history.

(56) References Cited

U.S. PATENT DOCUMENTS

| 9,799,708 | B2 | 10/2017 | Hong et al. | |
|---|---|---|---|---|
| 10,026,721 | B2* | 7/2018 | Kim | H01L 25/0753 |
| 2010/0330338 | A1* | 12/2010 | Boyce | B29C 59/02 |
| | | | | 428/156 |
| 2015/0311409 | A1 | 10/2015 | Huang et al. | |

(Continued)

FOREIGN PATENT DOCUMENTS

| CN | 104216153 A | 12/2014 |
|---|---|---|
| CN | 106816546 A | 6/2017 |

(Continued)

OTHER PUBLICATIONS

"Stretchable Displays are not a Stretch, Says LG Display", JoongAng Daily, Jun. 11, 2020 downloaded from URL<https://koreajoongangdaily.joins.com/2020/06/11/business/tech/LG-Display-flexible-display-stretchable-display/20200611184014955.html> on Mar. 1, 2022. (Year: 2020).*

*Primary Examiner* — J. E. Schoenholtz
(74) *Attorney, Agent, or Firm* — Banner & Witcoff, Ltd.

(57) ABSTRACT

A substrate and a display device. The substrate includes: a hole region including a plurality of holes penetrating the substrate; and a non-hole region including a plurality of connection portions and a plurality of pixel regions separated from each other. Each connection portion is between adjacent pixel regions to connect the adjacent pixel regions, wherein a straight line in any direction parallel to the substrate passes through the hole region.

16 Claims, 5 Drawing Sheets

(56) References Cited

U.S. PATENT DOCUMENTS

| | | |
|---|---|---|
| 2016/0049602 A1 | 2/2016 | Kim |
| 2016/0104756 A1 | 4/2016 | Lee et al. |
| 2016/0190389 A1* | 6/2016 | Lee .................... H01L 27/1255 |
| | | 257/93 |
| 2016/0293571 A1 | 10/2016 | Yoon et al. |
| 2016/0320878 A1 | 11/2016 | Hong et al. |
| 2017/0040306 A1* | 2/2017 | Kim ...................... H05K 1/181 |
| 2020/0161384 A1 | 5/2020 | Wang et al. |

FOREIGN PATENT DOCUMENTS

| | | |
|---|---|---|
| CN | 107425039 A | 12/2017 |
| CN | 208270884 U | 12/2018 |
| KR | 20140070107 A | 6/2014 |

\* cited by examiner

ND DISPLAY APPARATUS

The application is a U.S. National Phase Entry of International Application No. PCT/CN2019/092119 filed on Jun. 20, 2019, designating the United States of America and claiming priority to Chinese Patent Application No. 201821056640.4, filed on Jul. 4, 2018. The present application claims priority to and the benefit of the above-identified applications and the above-identified applications are incorporated by reference herein in their entirety.

TECHNICAL FIELD

At least one embodiment of the present disclosure relates to a substrate and a display device.

BACKGROUND

At present, display devices with bendable, foldable or stretchable characteristics are being used more and more widely. Generally, the components can be fabricated on a substrate with stretchable characteristics, which can provide the strain required when the display device is stretched.

SUMMARY

At least one embodiment of the present disclosure provides a substrate and a display device.

At least one embodiment of the present disclosure provides a substrate, including: a hole region including a plurality of holes penetrating the substrate; and a non-hole region including a plurality of pixel regions separated from each other and a plurality of connection portions, each of the connection portions being between adjacent pixel regions to connect the adjacent pixel regions. A straight line in any direction parallel to the substrate passes through the hole region.

In some examples, the plurality of pixel regions are arranged in an array in a first direction and a second direction, and the connection portions connected to two sides of each pixel region opposite in the first direction have a minimum distance therebetween greater than zero in a third direction perpendicular to the first direction; the connection portions connected to two sides of each pixel region opposite in the second direction have a minimum distance therebetween greater than zero in a fourth direction perpendicular to the second direction, and the third direction and the fourth direction are both parallel to the substrate.

In some examples, a minimum distance in the third direction and a minimum distance in the fourth direction between the connection portions respectively connected to two adjacent sides of each pixel region are both greater than zero.

In some examples, the connection portion connected to one side of each pixel region is located between two end points of the side in a direction parallel to the side.

In some examples, at least two connection portions are connected to two opposite and parallel sides of two adjacent pixel regions, and a sum of sizes of the at least two connection portions in an extension direction of the sides connected to the connection portions is smaller than a length of each of the sides.

In some examples, the plurality of connection portions are separated from each other.

In some examples, in at least one of the first direction and the second direction, at least one connection portion is provided between adjacent pixel regions.

In some examples, any two adjacent pixel regions is provided with the connection portions therebetween.

In some examples, only the hole is disposed between at least two adjacent pixel regions.

In some examples, the hole region is a closed region surrounded by a plurality of the pixel regions adjacent to each other and the connection portions connecting the plurality of the pixel regions adjacent to each other.

In some examples, an area of the hole region is not greater than an area of the non-hole region.

In some examples, the pixel regions are integrally formed with the connection portions.

In some examples, the plurality of connection portions each have the same shape and size.

In some examples, a shape of each of the pixel regions includes a rectangle or a hexagon.

In some examples, a shape of each of the connection portions includes a rectangle or a trapezoid.

In some examples, the substrate further including: a light emitting unit, a signal line and a thin film transistor in the non-hole region. The light emitting unit is in the pixel region, and the signal line is in the pixel region and the connection portion.

In some examples, the substrate is a flexible substrate.

In some examples, a material of the substrate has an elongation rate less than 10%.

At least one embodiment of the present disclosure further provides a display device including the substrate according to any example above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Figure 1A:
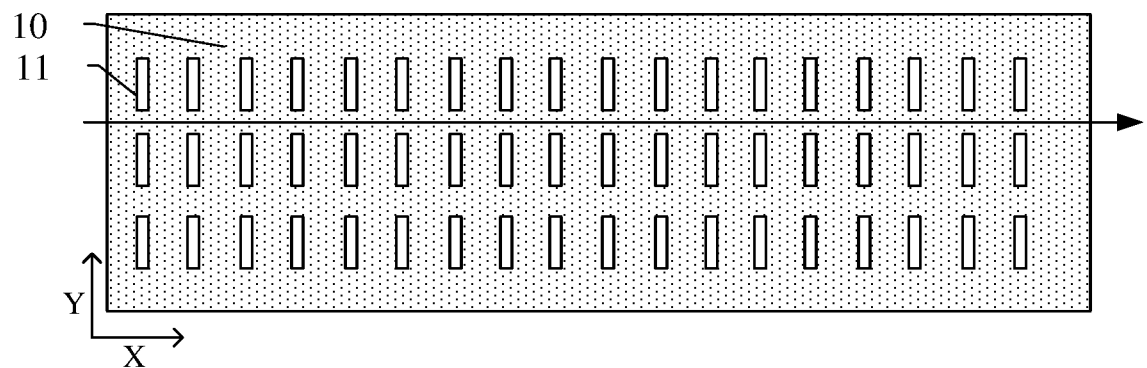
FIGS. 1A-1E are partial schematic views showing planar structures of a substrate provided with a plurality of holes.
Figure 1B:
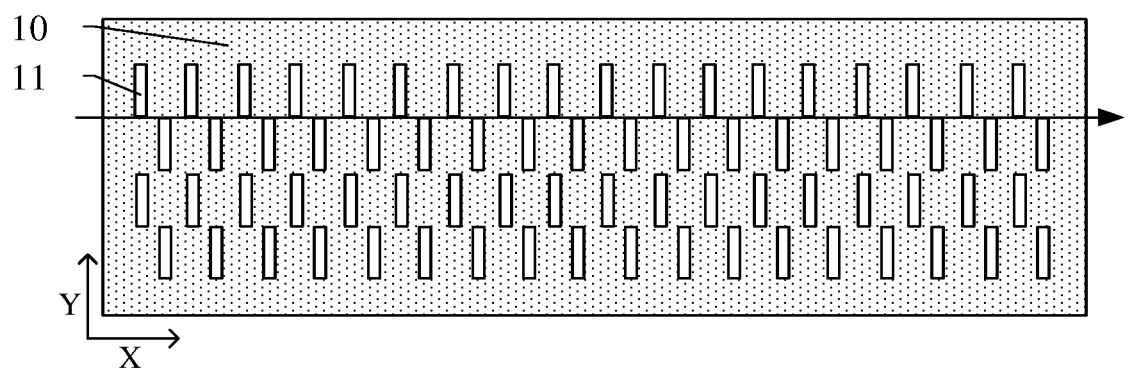
Figure 1C:
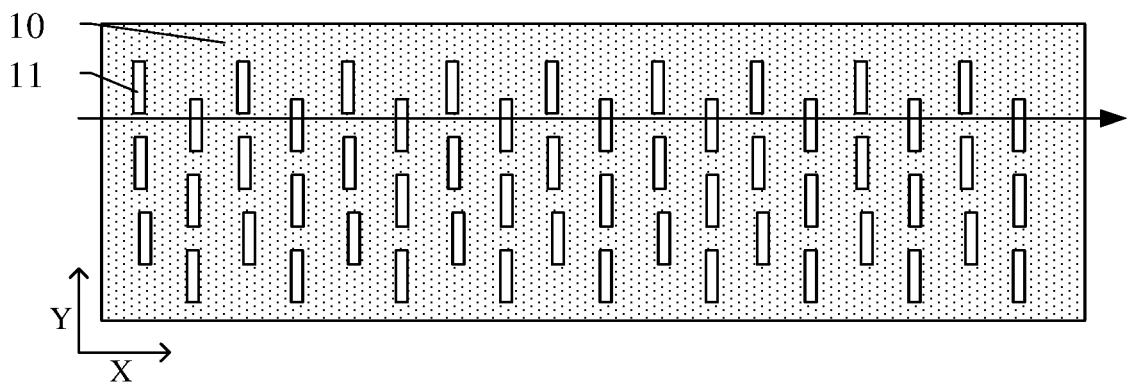

FIG. 1A-1C are partial schematic view showing planar structures of a substrate provided with a plurality of holes. As illustrated in FIG. 1A, a substrate 10 is provided with a plurality of holes 11 arranged in the X direction and the Y direction, and the holes 11 penetrate through the substrate 10 in a direction perpendicular to the substrate 10. FIGS. 1A-1C are described with an example of applying a force parallel to the X direction to the substrate 10 to bend or stretch the substrate 10. When a force as illustrated by an arrow in FIG. 1A is applied to the substrate 10, the holes 11 in the substrate 10 are limited by the non-hole region, so the holes 11 cannot provide deformation effectively, and the cross section of the substrate 10 in the force application direction is reduced due to the presence of the holes 11, so the substrate 10 is prone to fracture.

As illustrated in FIG. 1B, the substrate 10 is provided with a plurality of holes 11 arranged in a plurality of rows in the Y direction, the holes 11 of adjacent rows are offset from each other in the X direction, and the edge of the first row of holes 11 adjacent to the second row of holes is located on the same straight line as the edge of the second row of holes adjacent to the first row of holes. When the force applied to the substrate 10 is as illustrated by the arrow in FIG. 1B, the holes 11 in the substrate 10 are limited by the non-hole region, so the holes 11 cannot provide deformation effectively, and the substrate 10 cannot provide a degree of deformation greater than the material characteristics thereof, thus the substrate 10 is prone to fracture.

As illustrated in FIG. 1C, the substrate 10 is provided with a plurality of holes 11 arranged in a plurality of rows in the Y direction, the holes 11 of adjacent rows are offset from each other in the X direction, and the holes 11 of adjacent rows overlap in the Y direction. When the force applied to the substrate 10 is as illustrated by the arrow in FIG. 1C, the force passes through the holes 11, and the holes 11 can provide effective deformation. The strain generated by the substrate 10 is greater than the strain generated when the substrate 10 is not provided with the holes. Thus, the substrate 10 has better stretchability when subjected to the force illustrated in FIG. 1C.

Figure 1D:
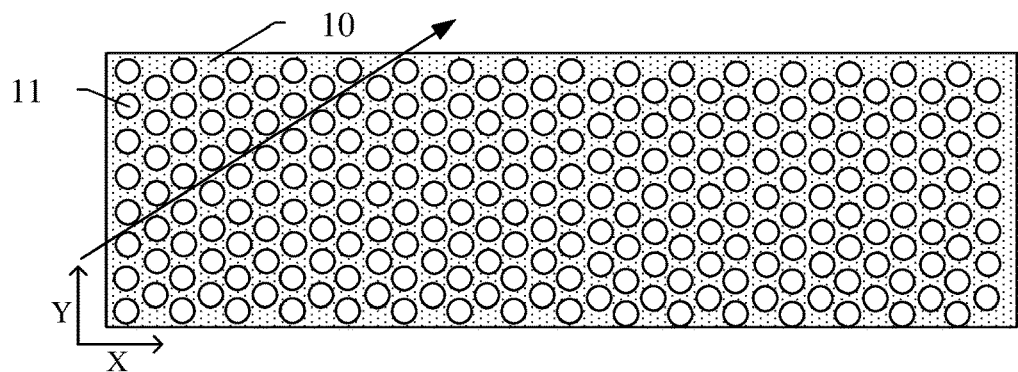
Figure 1E:
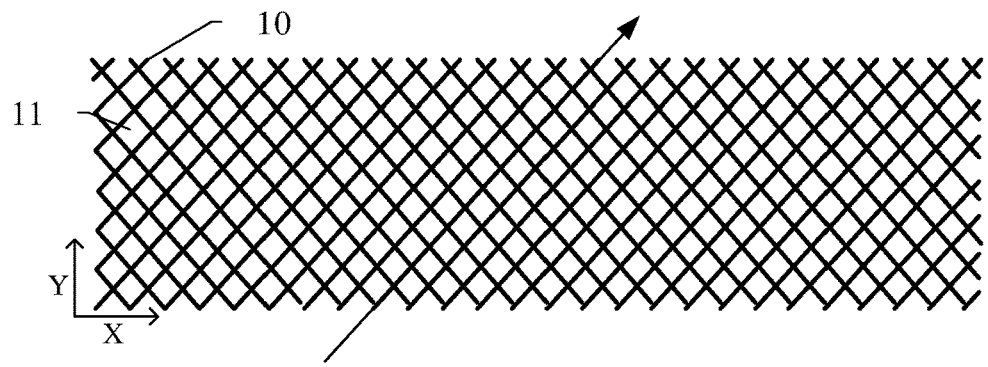

FIGS. 1D-1E are partial schematic views showing planar structures of other substrates provided with a plurality of holes. In FIGS. 1D-1E, when a force parallel to the X direction is applied to the substrate 10, at least some holes 11 exist in the direction of the force application. However, when a force in other directions is applied to the substrate 10, none of the holes 11 may exist in the direction of the force application (as illustrated by arrows in FIGS. 1D and 1E). At this time, the substrate 10 cannot provide a degree of deformation greater than the material characteristics thereof, and the substrate 10 is prone to fracture.

In the research, the inventor of this application found that the display device needs to be stretchable in all directions. Therefore, how to design a display substrate with stretchability in all directions has attracted extensive attention.

Embodiments of the present disclosure provide a substrate and a display device. The substrate provided by embodiments of the present disclosure includes a hole region which includes a plurality of holes penetrating the substrate; and a non-hole region including a plurality of connection portions and a plurality of pixel regions separated from each other, each connection portion being located between adjacent pixel regions to connect the adjacent pixel regions. A straight line with any direction parallel to the substrate passes through the hole region. The substrate provided by embodiments of the present disclosure can satisfy the requirement that the substrate has stretchability in any direction parallel to the substrate, and the substrate can be manufactured by using an existing process, and the process is simple.

The substrate and the display device provided by embodiments of the present disclosure will be described below with reference to the accompanying drawings.

Figure 2A:
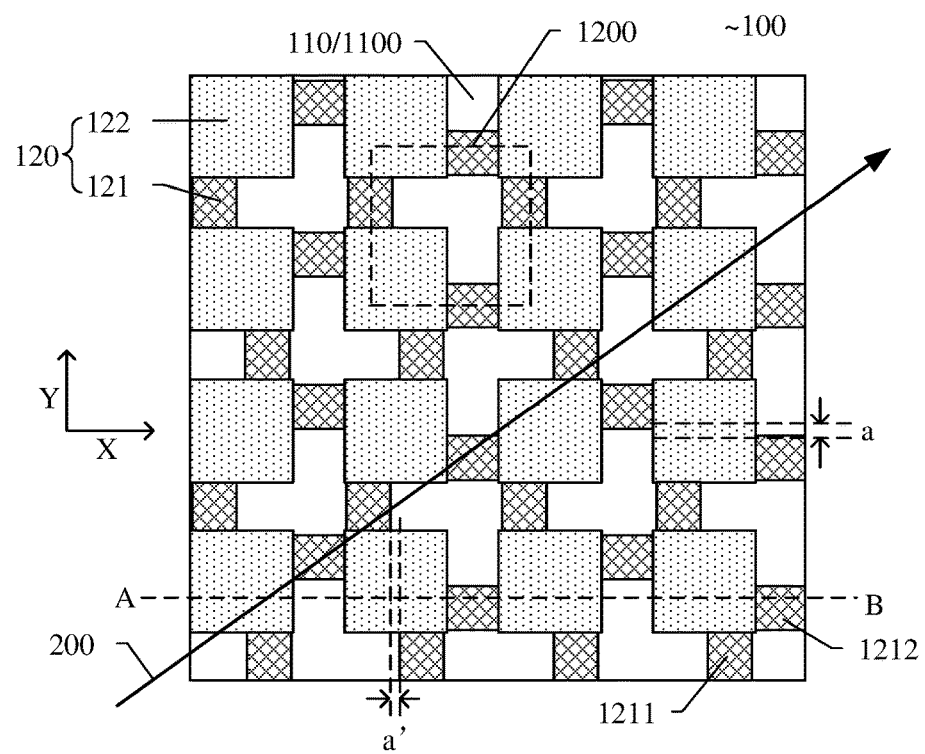
FIG. 2A is a partial schematic view showing a planar structure of a substrate according to an example of an embodiment of the present disclosure.

FIG. 2A is a partial schematic view showing a planar structure of a substrate according to an embodiment of the present disclosure. As illustrated in FIG. 2A, the substrate 100 includes a hole region 1100 including a plurality of holes 110 penetrating the substrate 100 in a direction perpendicular to the substrate 100; and a non-hole region 120. The non-hole region 120 includes a plurality of connection portions 121 and a plurality of pixel regions 122 separated from each other, and each connection portion 121 is located between adjacent pixel regions 122 to connect the adjacent pixel regions 122. The above-mentioned "a plurality of pixel regions separated from each other" means that although adjacent pixel regions 122 can be connected by the connection portion 121, the adjacent pixel regions 122 are spaced apart and independent of each other. As illustrated in FIG. 2A, a straight line 200 with any direction parallel to the substrate 100 passes through the hole region 1100, that is, when a force parallel to any direction of the substrate 100 is applied to the substrate 100, the direction of force application passes through at least one hole 110. At this time, in the direction of force application, the strain generated by the substrate 100 is greater than the strain that can be generated when the substrate 100 has no hole, that is, the substrate 100 generates a degree of deformation greater than the material characteristics thereof. That is, the continuous surface on which the force applied to the substrate 100 is transmitted is non-linear so that the substrate 100 can be stretchable. Therefore, the substrate provided by the embodiment of the present disclosure can satisfy the requirement that the substrate has stretchability in any direction parallel to the substrate.

For example, as illustrated in FIG. 2A, a closed region surrounded by a plurality of pixel regions 122 adjacent to each other and connection portions 121 connecting the plurality of pixel regions 122 adjacent to each other is the hole region 1100.

For example, as illustrated in FIG. 2A, four adjacent pixel regions 122 are respectively located at the four vertices of the quadrangle 1200, the connection portions 121 connecting the four pixel regions 122 are respectively located on the four sides of the quadrangle 1200, and the closed region surrounded by the four pixel regions 122 and the four connection portions 121 is an hole 110 included in the hole region 1100.

It should be noted that the "pixel region" here is only to illustrate a plurality of separate specific regions on the substrate, which can be used for disposing the pixel structure, but is not limited to the pixel structure that must be provided thereon. Therefore, the substrate here can be a base substrate used for forming a display substrate or a display substrate that has been already formed with a display pixel structure.

For example, as illustrated in FIG. 2A, the substrate 100 is a flexible substrate. For example, the material of the substrate 100 can include polyimide (PI), polycarbonate (PC), polymethyl methacrylate (PMMA), and the like, and the present embodiment is not limited thereto.

For example, as illustrated in FIG. 2A, the elongation rate of the material of the substrate 100 is less than 10%, that is, the elongation rate of the substrate 100 when the holes 110 are not provided is less than 10%, therefore, the stretchability of the substrate itself provided in this embodiment is low when the holes are not provided. However, in this embodiment, because the substrate is provided with a plurality of holes 110, the stretchability of the entire substrate 100 can be improved. For example, the stretchability of the substrate 100 provided with the holes 110 in this embodiment can be doubled as compared with the stretchability without the holes. This embodiment is not limited to this, for example, the stretchability can be further improved.

For example, in this embodiment, the pixel region 122 and the connection portion 121 are integrally formed, that is, when the substrate 100 provided in this embodiment is manufactured, one patterning process can be adopted, thereby saving process steps and manufacturing difficulty.

For example, as illustrated in FIG. 2A, the area of the region where the holes 110 are provided on the substrate 100 is not greater than the area of the non-hole region 120, that is, the area of the hole region 1100 is not greater than the area of the non-hole region 120, so that the substrate can not only satisfy the stretchability in any direction parallel to the substrate, but also is not easy to fracture during stretching.

For example, as illustrated in FIG. 2A, the plurality of pixel regions 122 are arrayed in an array in a first direction (i.e., X direction) and a second direction (i.e., Y direction). The example illustrated in FIG. 2A is described with the first direction and the second direction being perpendicular to each other as an example, but is not limited thereto.

For example, the shape of the pixel region 122 in the example illustrated in FIG. 2A includes a rectangle, and when the shape of the pixel region 122 is rectangular, the first direction and the second direction are two directions parallel to adjacent sides of the pixel region 122, respectively.

For example, as illustrated in FIG. 2A, a connection portion 121 is provided between two adjacent pixel regions 122 in the first direction. In the second direction, a connection portion 121 is provided between two adjacent pixel regions 122. In addition, in this embodiment, the connection portion 121 is only provided between the pixel regions 122 adjacent to each other in the first direction and between the pixel regions 122 adjacent to each other in the second direction. However, it is not limited to this, and the connection portion can be also disposed between pixel regions adjacent to each other in other directions as long as the straight line 200 with any direction parallel to the substrate 100 passes through at least one hole 110.

For example, as illustrated in FIG. 2A, the connection portions 121 connected to two sides of each pixel region 122 opposite to each other in the first direction have a minimum distance greater than zero therebetween in a third direction perpendicular to the first direction, and the third direction here is the Y direction. That is, the connection portions 121 located on opposite sides of each pixel region 122 in the first direction do not overlap at all in the second direction. That is, the connection portions 121 respectively connected to the two sides of each pixel region 122 extending in the Y direction do not overlap at all in the Y direction.

Similarly, as illustrated in FIG. 2A, the connection portions 121 connected to two sides of each pixel region 122 opposite to each other in the second direction have a minimum distance greater than zero therebetween in a fourth direction perpendicular to the second direction, and the fourth direction here is the X direction. That is, the connection portions 121 located on opposite sides of each pixel region 122 in the second direction do not overlap at all in the first direction. That is, the connection portions 121 respectively connected to the two sides of each pixel region 122 extending in the X direction do not overlap at all in the X direction.

In this embodiment, the size and positional relationship between the connection portion and the pixel region can ensure that the force applied in any direction parallel to the substrate passes through the hole region (e.g., at least one hole), so that the substrate has stretchability in any direction.

For example, as illustrated in FIG. 2A, the plurality of connection portions 121 are separated from each other. The above-mentioned "separated from each other" means that although the connection portions 121 are connected to the pixel region 122, each two connection portions 121 are spaced apart and independent of each other, so as to ensure that a force applied in any direction parallel to the substrate 100 passes through at least one hole 110.

For example, as illustrated in FIG. 2A, the minimum distance in the third direction (i.e., the Y direction illustrated in FIG. 2A) and the minimum distance in the fourth direction (i.e., the X direction illustrated in FIG. 2A) of the connection portions 121 respectively connected to two adjacent sides of each pixel region 122 are both greater than zero.

For example, as illustrated in FIG. 2A, the connection portion 121 connected to the side parallel to the X direction of the pixel region 122 is a first connection portion 1211, the connection portion 121 connected to the side parallel to the Y direction of the pixel region 122 is a second connection portion 1212, the first connection portion 1211 and the second connection portion 1212 connected to the same pixel region 122 do not overlap in the X direction, and the first connection portion 1211 and the second connection portion 1212 do not overlap in the Y direction, thus ensuring that the connection portions 121 connected to adjacent sides of the pixel region 122 are separated from each other.

For example, as illustrated in FIG. 2A, the connection portion 121 connected to one side of each pixel region 122 is located between the two end points of the side in a direction parallel to the side, that is, the first connection portion 1211 connected to the side extending in the X direction of each pixel region 122 is located between the two end points of the side in the X direction. Similarly, the second connection portion 1212 connected to the side extending in the Y direction of each pixel region 122 is located between the two end points of the side in the Y direction. Therefore, it is further ensured that the connection portions 121 connected to the adjacent sides of the pixel region 122 are separated from each other.

For example, as illustrated in FIG. 2A, the plurality of connection portions 121 each have the same shape and size, and the plurality of pixel regions 122 each have the same shape and size, thus ensuring that the plurality of connection portions 121 are uniformly stressed during the stretching process of the substrate 100, and preventing the substrate 100 from being fractured due to uneven stress at a certain place during the stretching process.

For example, in FIG. 2A, the shape of the connection portion 121 is described as a rectangle. At this time, the minimum distance in the second direction of the connection portions 121 connected to both sides of each pixel region 122 extending in the second direction is "a" illustrated in FIG. 2A, and similarly, the minimum distance in the first direction of the connection portions 121 connected to both sides of each pixel region 122 extending in the first direction is "a'" illustrated in FIG. 2A. The substrate with the rectangular connection portions provided by this embodiment of the present disclosure can be manufactured by the existing manufacturing process, and the process is simple.

Figure 2B:
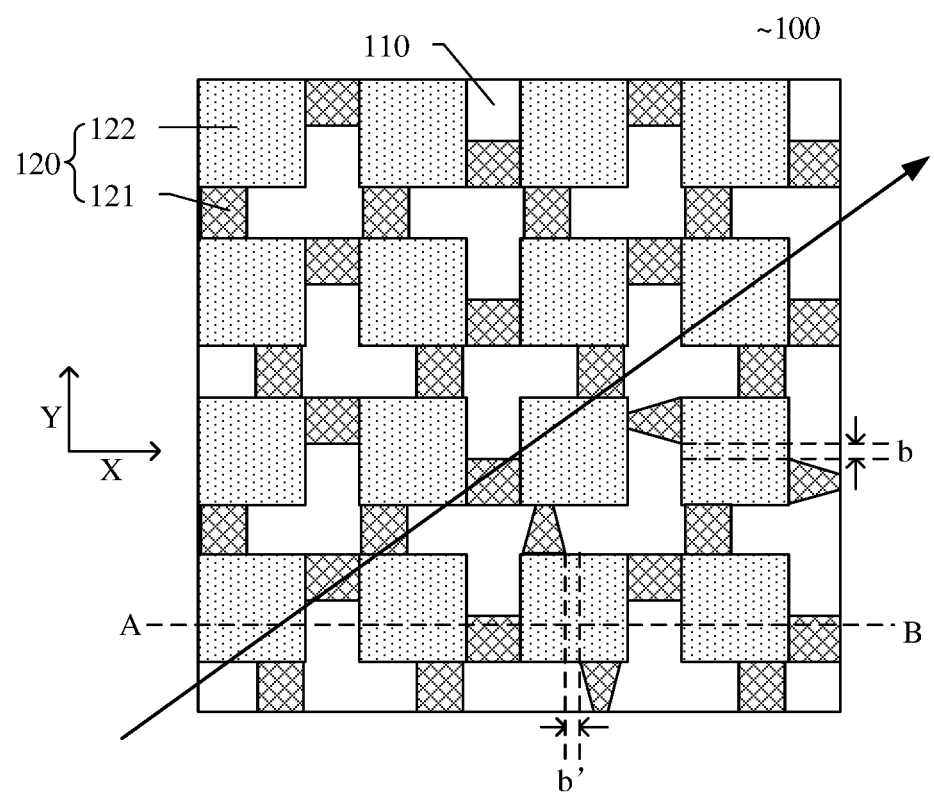
FIG. 2B is a partial schematic view showing a planar structure of a substrate according to another example of an embodiment of the present disclosure.

For example, FIG. 2B is a partial schematic view showing the planar structure a substrate according to another example of an embodiment of the present disclosure. As illustrated in FIG. 2B, the shapes of the plurality of connection portions 121 in this example may not be exactly the same. For example, the shapes of the plurality of connection portions 121 can include rectangles and trapezoids. At this time, the minimum distance in the second direction of the connection portions 121 respectively connected to both sides of each pixel region 122 extending in the second direction is "b" illustrated in FIG. 2B, and the minimum distance in the first direction of the connection portions 121 respectively connected to both sides of each pixel region 122 extending in the first direction is "b'" illustrated in FIG. 2B. This example is not limited to this, and the shapes of the connection portions can also be trapezoidal.

For example, as illustrated in FIGS. 2A and 2B, a connection portion 121 can be provided between adjacent pixel regions 122. At this time, the maximum dimension in the Y direction of the connection portion 121 connected to the side extending in the Y direction of the pixel region 122 is less than half of the dimension in the Y direction of the pixel region 122, so that the minimum distance in the Y direction of the connection portion 121 respectively connected to the side extending in the Y direction of each pixel region 122 is greater than zero. Similarly, the maximum dimension in the X direction of the connection portion 121 connected to the side extending in the X direction of the pixel region 122 is less than half of the dimension in the X direction of the pixel region 122, so that the minimum distance in the X direction of the connection portion 121 connected to the side extending in the X direction of each pixel region 122 is greater than zero.

For example, the size of each pixel region 122 in the X direction can be 200 to 1000 µm, and the maximum size of each connection portion 121 in the X direction can be 20 to 160 µm. This embodiment includes but is not limited to this.

This embodiment is not limited to this. When the maximum dimension in the Y direction of the connection portion connected to one of the two sides extending in the Y direction of any pixel region is greater than one half of the dimension in the Y direction of the pixel region, the maximum dimension in the Y direction of the connection portion connected to the other of the two sides extending in the Y direction of the pixel region is less than one half of the dimension in the Y direction of the pixel region, thereby ensuring that the minimum distance in the Y direction between the connection portions respectively connected to the two sides extending in the Y direction of each pixel region is greater than zero. Similarly, when the maximum dimension in the X direction of the connection portion connected to one of the two sides extending in the X direction of each pixel region is greater than one half of the dimension in the X direction of the pixel region, the maximum dimension in the X direction of the connection portion connected to the other of the two sides extending in the X direction of each pixel region is less than one half of the dimension in the X direction of the pixel region, thereby ensuring that the minimum distance in the X direction between the connection portions respectively connected to the two sides extending in the X direction of each pixel region is greater than zero.

Figure 3:
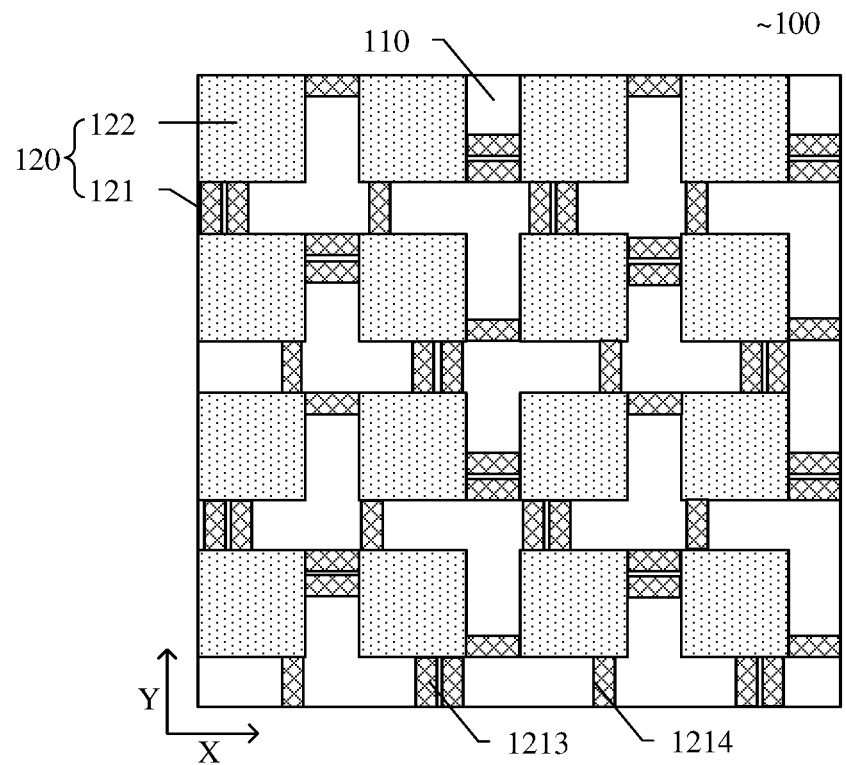
FIG. 3 is a partial schematic view showing a planar structure of a substrate according to another example of an embodiment of the present disclosure.

For example, FIG. 3 is a partial schematic view showing the planar structure of a substrate according to another example of an embodiment of the present disclosure. As illustrated in FIG. 3, at least one connection portion 121 is provided between adjacent pixel regions 122 in at least one of the first direction and the second direction. The example illustrated in FIG. 3 is described with the example that the number of the connection portions 121 provided between adjacent pixel regions 122 is not exactly the same, but is not limited thereto. For example, two connection portions or more connection portions can be provided between adjacent pixel regions.

For example, as illustrated in FIG. 3, no matter how many connection portions 121 are provided between adjacent pixel regions 122, the minimum distance in the third direction between the connection portions 121 connected to both sides opposite to each pixel region 122 in the first direction is greater than zero. In addition, the minimum distance in the fourth direction between the connection portions 121 connected to the opposite sides of each pixel region 122 in the second direction is greater than zero, so that the force applied in any direction parallel to the substrate can be ensured to pass through at least one hole, and therefore, the substrate has stretchability in any direction.

For example, as illustrated in FIG. 3, when one side of the pixel region 122 is connected to a plurality of connection portions 121, these connection portions 121 are separated from each other.

For example, as illustrated in FIG. 3, at least two connection portions 121 are connected to two opposite and parallel sides of two adjacent pixel regions 122, and the sum of the sizes of the at least two connection portions 121 in the extension direction of the sides connected to the connection portions is smaller than the length of each of the sides.

For example, as illustrated in FIG. 3, the plurality of connection portions 121 each have the same shape and size.

For example, as illustrated in FIG. 3, the number of connection portions 121 provided between adjacent pixel regions 122 is not exactly the same.

For example, as illustrated in FIG. 3, the number of connection portions 121 provided between adjacent pixel regions 122 includes one and two. Two connection portions 121 form a connection portion pair 1213, and a single connection portion 121 is a connection portion unit 1214 as an example.

For example, as illustrated in FIG. 3, the connection portion pairs 1213 and the connection portion units 1214 located between pixel regions 122 arranged in the first direction are alternately arranged, and the connection portion pairs 1213 and the connection portion units 1214 located between pixel regions 122 arranged in the second direction are also alternately arranged.

For example, as illustrated in FIG. 3, the pixel regions 122 arranged in the Y direction are pixel region columns, and the connection portion pairs 1213 and the connection portion units 1214 located between adjacent pixel region columns are alternately arranged in the Y direction. Similarly, the pixel regions 122 arranged in the X direction are pixel region rows, and the connection portion pairs 1213 and the connection portion units 1214 located between adjacent pixel region rows are also alternately arranged in the X direction, so that the substrate 100 basically maintains uniform stress throughout the stretching process.

Figure 4A:
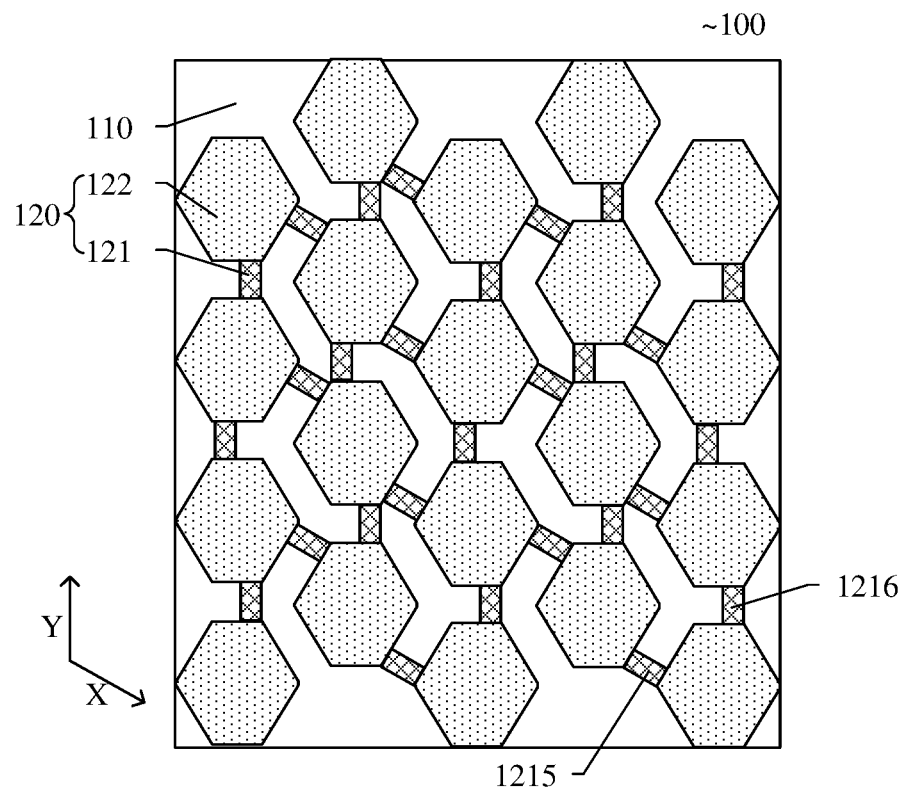
FIG. 4A is a partial schematic view showing a planar structure of a substrate according to an example of another embodiment of the present disclosure.

For example, FIG. 4A is a partial schematic view showing the planar structure of a substrate according to an example of another embodiment of the present disclosure. As illustrated in FIG. 4A, each pixel region 122 has a hexagonal shape, and the plurality of pixel regions 122 are arrayed in an array in the first direction and the second direction. As illustrated in FIG. 4A, when the shape of the pixel region 122 is hexagonal, the first direction (i.e., X direction) is a direction perpendicular to one side of the pixel region 122, and the second direction (i.e., Y direction) is a direction perpendicular to another side of the pixel region 122, i.e., the X direction and the Y direction are respectively directions perpendicular to two adjacent sides of the hexagon. The angle between the first direction and the second direction in this embodiment can be 120 degrees or 60 degrees. In the example illustrated in FIG. 4A, the angle between the first direction and the second direction is 120 degrees.

For example, as illustrated in FIG. 4A, a connection portion 121 is provided between two adjacent pixel regions 122 in the first direction. In the second direction, a connection portion 121 is provided between two adjacent pixel regions 122. Also, in an example of this embodiment, the connection portion 121 is only provided between pixel regions 122 adjacent to each other in the first direction and between pixel regions 122 adjacent to each other in the second direction.

For example, as illustrated in FIG. 4A, the connection portions 121 connected to the two sides of each pixel region 122 opposite in the first direction have a minimum distance therebetween greater than zero in the third direction perpendicular to the first direction, and the third direction here is the direction perpendicular to the X direction. In addition, the connection portions 121 connected to the two sides of each pixel region 122 opposite in the second direction have a minimum distance therebetween greater than zero in the fourth direction perpendicular to the second direction, the fourth direction here is the direction perpendicular to the Y direction, so that the force applied in any direction parallel to the substrate can be ensured to pass through at least one hole, and therefore, the substrate has stretchability in any direction. The third direction and the fourth direction are both parallel to the substrate.

For example, as illustrated in FIG. 4A, the minimum distances in the third direction and the fourth direction of the connection portions 121 respectively connected to the two adjacent sides of each pixel region 122 are greater than zero.

For example, as illustrated in FIG. 4A, the connection portion 121 connected to the side extending perpendicularly to the X direction (i.e., the side extending in the third direction) of the pixel region 122 is the third connection portion 1215, the connection portion 121 connected to the side extending perpendicularly to the Y direction (i.e., the side extending in the fourth direction) of the pixel region 122 is the fourth connection portion 1216, the third connection portion 1215 and the fourth connection portion 1216 connected to the same pixel region 122 do not overlap in the third direction, and the third connection portion 1215 and the fourth connection portion 1216 connected to the same pixel region 122 do not overlap in the fourth direction.

For example, as illustrated in FIG. 4A, there is only the hole 110 between at least two adjacent pixel regions 122. For example, in a direction having an included angle of 60 degrees with both the X direction and the Y direction, no connection portion 121 is provided between adjacent pixel regions 122, and only a hole 110 is provided.

For example, the substrate illustrated in FIG. 4A has the same structure features as the substrate illustrated in FIG. 2A, and will not be described here again.

Figure 4B:
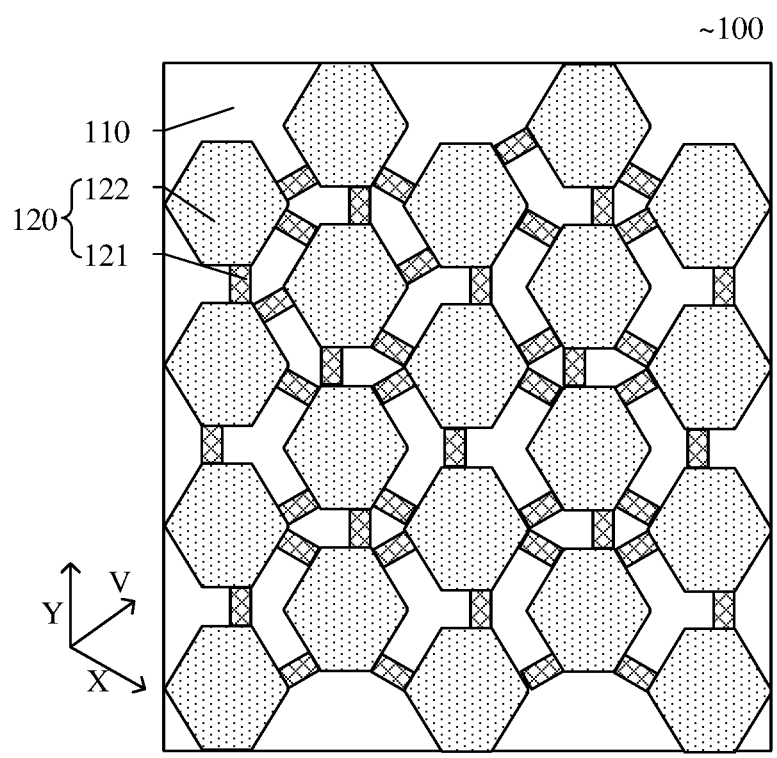
FIG. 4B is a partial schematic view showing a planar structure of a substrate according to another example of another embodiment of the present disclosure.

For example, FIG. 4B is a partial schematic view showing the planar structure of a substrate according to another example of another embodiment of the present disclosure. As illustrated in FIG. 4B, what is different from the example illustrated in FIG. 4A is, the connection portion 121 in this example is not only disposed between pixel regions 122 adjacent to each other in the X direction or the Y direction, but can be further disposed between pixel regions 122 adjacent to each other in other directions, for example, in the V direction illustrated in FIG. 4B. For example, the V direction can be a direction in which the included angle between the X direction and the Y direction are both 60 degrees, that is, the V direction is a direction along an angular bisector of the angle between the X direction and the Y direction, and the V direction is also a direction perpendicular to one side of the hexagon. In the example illustrated in FIG. 4B, it is sufficient to ensure that a straight line 200 in any direction parallel to the substrate 100 passes through at least one hole 110.

In the example illustrated in FIG. 4B, a connection portion 121 is provided between any two adjacent pixel regions 122 to reduce the probability of fracture of the substrate 100 during stretching.

It should be noted that the first direction and the second direction in this embodiment can refer to the X direction and the Y direction, the X direction and the V direction, or the Y direction and the V direction, and correspondingly, the third direction and the fourth direction can refer to the direction perpendicular to the X direction and the direction perpendicular to the Y direction, the direction perpendicular to the X direction and the direction perpendicular to the V direction, or the direction perpendicular to the Y direction and the direction perpendicular to the V direction. The third direction and the fourth direction are both parallel to the substrate.

For example, the substrate illustrated in FIG. 4B has the same structure features as the substrate illustrated in FIG. 2A, and will not be described here again.

Figure 5:
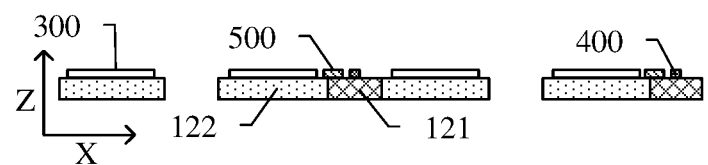
FIG. 5 is a sectional schematic view of the substrate illustrated in FIG. 2A taken along line AB.

For example, FIG. 5 is a sectional schematic view of the substrate illustrated in FIG. 2A taken along line AB. As illustrated in FIG. 5, the pixel region 122 further includes a light emitting unit 300, that is, the substrate 100 provided by the embodiment of the present disclosure can be an array substrate.

For example, a red pixel, a green pixel, a blue pixel, and the like can be disposed on the pixel region 122, and this embodiment includes but is not limited to this.

For example, as illustrated in FIG. 5, the light emitting unit 300 can include a pixel electrode and a common electrode. At this time, the array substrate provided by the embodiment of the present disclosure can be applied to a liquid crystal display device. The present embodiment is not limited to this, and the light emitting unit 300 can also include a cathode, an anode, and a light emitting layer located between the cathode and the anode. At this time, the array substrate provided in the embodiment of the present disclosure can also be applied to an organic light emitting diode display device, and the present embodiment is not limited to this.

For example, as illustrated in FIG. 5, the substrate further includes a pixel driving circuit located in the non-hole region, such as a thin film transistor 500 and a storage capacitor.

For example, as illustrated in FIG. 5, the substrate further includes a signal line 400 located in the non-hole region. Because the signal line 400 is used to transmit signals for the pixel and needs to be connected to the pixel, the signal line 400 is located at both the pixel region 122 and the connection portion 121.

For example, the signal line 400 includes a gate line and a data line. For example, the gate line can extend in the X direction and the data line can extend in the Y direction. This embodiment includes but is not limited to this.

For example, the thin film transistor 500 can be located only at the pixel region 122, and can also be located only at the connection portion 121, and can further be located at both the pixel region 122 and the connection portion 121. This embodiment includes but is not limited to this.

This embodiment provides a display device including the substrate provided in any one of the above embodiments. The display device using the substrate has good stretchability in all directions parallel to the substrate.

For example, the display device can be a display device such as a liquid crystal display device or an organic light emitting diode (OLED) display device, as well as any product or component having a display function such as a television, a digital camera, a mobile phone, a watch, a tablet computer, a notebook computer, a navigator and the like, and the present embodiment is not limited thereto.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined with each other.

What have been described above are only specific implementations of the present disclosure, the protection scope of the present disclosure is not limited thereto. The protection scope of the present disclosure should be based on the protection scope of the claims.

The invention claimed is:

1. A substrate comprising:
   a hole region comprising a plurality of holes penetrating the substrate; and
   a non-hole region comprising a plurality of pixel regions separated from each other and a plurality of connection portions, each of the connection portions being between adjacent pixel regions to connect the adjacent pixel regions,
   wherein a straight line in any direction parallel to the substrate passes through the hole region,
   wherein the plurality of pixel regions are arranged in an array in a first direction and a second direction, and connection portions connected to two sides of each pixel region opposite in the first direction have a minimum distance therebetween greater than zero in a third direction perpendicular to the first direction, connection portions connected to two sides of each pixel region opposite in the second direction have a minimum distance therebetween greater than zero in a fourth direction perpendicular to the second direction, and the third direction and the fourth direction are both parallel to the substrate,
   wherein a connection portion connected to one side of each pixel region is located between two end points of the one side in a direction parallel to the one side,
   wherein at least two connection portions are connected to two opposite and parallel sides of each of the adjacent pixel regions which are not located at an edge of the array, and a sum of sizes of the at least two connection portions in an extension direction of the parallel sides connected to the connection portions is smaller than a length of each of the parallel sides.

2. The substrate according to claim 1, wherein a minimum distance in the third direction and a minimum distance in the fourth direction between connection portions respectively connected to two adjacent sides of each pixel region are both greater than zero.

3. The substrate according to claim 1, wherein the plurality of connection portions are separated from each other.

4. The substrate according to claim 1, wherein, in at least one of the first direction and the second direction, at least one connection portion is provided between adjacent pixel regions.

5. The substrate according to claim 1, wherein any two adjacent pixel regions are provided with the connection portions therebetween.

6. The substrate according to claim 1, wherein only one of the plurality of holes is disposed between two adjacent pixel regions.

7. The substrate according to claim 1, wherein the hole region is a closed region surrounded by a plurality of the pixel regions adjacent to each other and the connection portions connecting the plurality of the pixel regions adjacent to each other.

8. The substrate according to claim 1, wherein an area of the hole region is not greater than an area of the non-hole region.

9. The substrate according to claim 1, wherein the pixel regions are integrally formed with the connection portions.

10. The substrate according to claim 1, wherein the plurality of connection portions each have the same shape and size.

11. The substrate according to claim 1, wherein a shape of each of the pixel regions comprises a rectangle or a hexagon.

12. The substrate according to claim 1, wherein a shape of each of the connection portions comprises a rectangle or a trapezoid.

13. The substrate according to claim 1, further comprising:
   a light emitting unit, a signal line, and a thin film transistor in the non-hole region,
   wherein the light emitting unit is in the pixel region, and the signal line is in the pixel region and in the connection portion.

14. The substrate according to claim 1, wherein the substrate is a flexible substrate.

15. The substrate according to claim 1, wherein an elongation rate of the substrate when the plurality of holes are not provided is less than 10%.

16. A display device comprising the substrate according to claim 1.

* * * * *